(12) United States Patent
Satarzadeh et al.

(10) Patent No.: US 8,390,490 B2
(45) Date of Patent: Mar. 5, 2013

(54) COMPRESSIVE SENSING ANALOG-TO-DIGITAL CONVERTERS

(75) Inventors: Patrick Satarzadeh, Addison, TX (US); Marco Corsi, Parker, TX (US); Victoria Wang, Dallas, TX (US); Arthur J. Redfern, Plano, TX (US); Fernando Mujica, Allen, TX (US); Charles Sestok, Dallas, TX (US); Kun Shi, Richardson, TX (US); Venkatesh Srinivasan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 125 days.

(21) Appl. No.: 13/106,585

(22) Filed: May 12, 2011

(65) Prior Publication Data

US 2012/0286981 A1 Nov. 15, 2012

(51) Int. Cl.
*H03M 1/12* (2006.01)
(52) U.S. Cl. ........................................ 341/123; 341/155
(58) Field of Classification Search .................. 341/122, 341/123, 155
See application file for complete search history.

(56) References Cited

U.S. PATENT DOCUMENTS

| | | | | |
|---|---|---|---|---|
| 4,908,622 | A * | 3/1990 | Turai | 341/122 |
| 6,700,516 | B1 * | 3/2004 | MacDonald | 341/122 |
| 7,324,036 | B2 | 1/2008 | Petre et al. | |
| 7,432,843 | B2 * | 10/2008 | Brady et al. | 341/155 |
| 7,834,795 | B1 | 11/2010 | Dudgeon et al. | |
| 7,961,126 | B2 * | 6/2011 | Deval et al. | 341/155 |

OTHER PUBLICATIONS

"Theory and Implementation of an Analog-to-Information Converter using Random Demodulation," IEEE Intl. Symposium on Circuits and Systems, May 27-30, 2007, pp. 1959-1962 (Jason N. Laska, Sami Kirolos, Marco F. Duarte, Tamer S. Ragheb, Richard G. Baraniuk, Yehia Massoud).
"Sampling Rate Reduction for 60 GHz UWB Communication Using Compressive Sensing," Asilomar Conference on Signals, Systems & Computers, 2009, pp. 1125-1129 (Jia (Jasmine) Meng, Javad Ahmadi-Shokouh, Husheng Li, E. Joe Charlson, Zhu Han, Sima Noghanian, and Ekram Hossain2.
"Compressive Sensing Using Random Demodulation," University of Tennessee—Knoxville, 2009 (Thesis) (Benjamin Scott Boggess).
"An Introduction to Compressive Sampling," IEEE SP Magazine, Mar. 2008 (Candes).
"Beyond Nyquist: Efficient Sampling of Sparse Bandlimited Signals," IEEE Transactions on Information Theory, vol. 56, No. 1, Jan. 2010, pp. 520-544 (Joel A. Tropp, Jason N. Laska, Marco F. Duarte, Justin K. Romberg, and Richard G. Baraniuk).
"A Sub-Nyquist Rate Sampling Receiver Exploiting Compressive Sensing," IEEE Transactions on Circuits and Systems—I: Regular Papers, Mar. 2011, pp. 507-520 (Xi Chen, Zhuizhuan Yu, Sebastian Hoyos, Brian M. Sadler, and Jose Silva-Martinez).

* cited by examiner

*Primary Examiner* — Howard Williams
(74) *Attorney, Agent, or Firm* — Alan A. R. Cooper; Wade J. Brady, III; Frederick J. Telecky, Jr.

(57) ABSTRACT

Compressive sensing is an emerging field that attempts to prevent the losses associated with data compression and improve efficiency overall, and compressive sensing looks to perform the compression before or during capture, before energy is wasted. Here, several analog-to-digital converter (ADC) architectures are provided to perform compressive sensing. Each of these new architectures selects resolutions for each sample substantially at random and adjusts the sampling rate as a function of these selected resolutions.

27 Claims, 7 Drawing Sheets

COMPRESSIVE SENSING ANALOG-TO-DIGITAL CONVERTERS

TECHNICAL FIELD

The invention relates generally to analog-to-digital converters (ADCs) and, more particularly, to compressive sensing ADCs (CS-ADCs) or compressive sensing analog-to-information (A2I) converters.

BACKGROUND

Digital compression has become ubiquitous and has been used in a wide variety of applications (such as video and audio applications). When looking to image capture (i.e., photography) as an example, a image sensor (i.e., charged-coupled device or CCD) is employed to generate analog image data, and an ADC is used to convert this analog image to a digital representation. This type of digital representation (which is raw data) can consume a huge amount of storage space, so an algorithm is employed to compress the raw (digital) image into a more compact format (i.e., Joint Photographic Experts Group or JPEG). By performing the compression after the image has been captured and converted to a digital representation, energy (i.e., battery life) is wasted. This type of loss is true for nearly every application in which data compression is employed.

Compressive sensing is an emerging field that attempts to prevent the losses associated with data compression and improve efficiency overall. Compressive sensing looks to perform the compression before or during capture, before energy is wasted. To accomplish this, one should look to adjusting the theory under which the ADCs operate, since the majority of the losses are due to the data conversion. For ADCs to perform properly under conventional theories, the ADCs should sample at twice this highest rate of the analog input signal (i.e., audio signal), which is commonly referred to as the Shannon-Nyquist rate. Compressive sensing should allow for a sampling rate well-below the Shannon-Nyquist rate so long as the signal of interest is sparse in some arbitrary representing domain and sampled or sensed in a domain which is incoherent with respect to the representation domain.

Turning to FIG. 1, an example of a conventional CS-ADC 100 can be seen. As shown, a demodulator 103 (which is commonly referred to as a pseudorandom demodulator) smears an input signal (i.e., signal from amplifier 102) over a spectrum. This is generally accomplished by mixing a clock signal from a phase locked loop (PLL) 104 with sequences from sequencers 108-1 to 108-N (that are each coupled to memory 105 to receive a known sequence) by mixers 106-1 to 106-N. ADC pipeline 109-1 then uses an integrator 110-1 to 110-N (which functions as an anti-aliasing filter), a buffer 112-1 to 112-N, and a low rate Nyquist ADC 114-1 to 114-N. Effectively, the demodulator 103 creates nonuniform sampling intervals that appear to be random.

Some other conventional circuits are: U.S. Pat. No. 7,324, 036; U.S. Pat. No. 7,834,795; Laska et al., "Theory and Implementation of an Analog-to-Information Converter Using Random Demodulation," *IEEE Intl. Symposium on Circuits and Systems*, May 27-30, 2007, pp. 1959-1962; Meng et al., "Sampling Rate Reduction for 60 GHz UWB Communication Using Compressive Sensing," *Asilomar Conference on Signals, Systems & Computers*, 2009; Benjamin Scott Boggess, "Compressive Sensing Using Random Demodulation" (Master's Thesis), 2009; Candes et al., "An Introduction to Compressive Sensing," *IEEE SP Magazine*, March 2008; Tropp et al., "Beyond Nyquist: Efficient Sampling of Sparse Bandlimited Signals", *IEEE Transactions on Information Theory*, January 2010; and Chen et al., "A Sub-Nyquist Rate Sampling Receiver Exploiting Compressive Sensing", *IEEE Transactions on Circuits and Systemes-I, Reg. Papers*, March 2011.

SUMMARY

An embodiment of the present invention, accordingly, provides an apparatus. The apparatus comprises a sample-and-hold (S/H) circuit; and a quantization circuit that is coupled to the S/H circuit so as to receive a plurality of samples from the S/H circuit, wherein the quantization circuit generates a digital output signal for each sample, and wherein each resolution for each digital output signal is selected substantially at random, and wherein intervals between consecutive samples are each based at least in part on the resolution of at least one of its samples.

In accordance with a preferred embodiment of the present invention, the quantization circuit further comprises a quantization loop such that each resolution for each digital output signal corresponds to its number of iterations through the quantization loop.

In accordance with a preferred embodiment of the present invention, the quantization loop further comprises a timing circuit that generates a clock signal and a sample clock signal, wherein the sample clock signal is provided to the S/H circuit.

In accordance with a preferred embodiment of the present invention, the quantization loop further comprises a quantizer that is coupled to the S/H circuit so as to receive the plurality of samples and that is coupled to the timing circuit so as to receive the clock signal.

In accordance with a preferred embodiment of the present invention, the quantizer further comprises a comparator, and wherein the quantization loop further comprises: a successive approximation register (SAR) controller that is coupled to the quantizer and the timing circuit; and a capacitive digital-to-analog converter (CDAC) that is coupled to the SAR controller and the comparator.

In accordance with a preferred embodiment of the present invention, the quantizer further comprise a comparator that receives a reference signal, and wherein the quantization loop further comprises: a digital-to-analog converter (DAC) that is coupled to the comparator and that receives the reference signal; an adder that is coupled to the S/H circuit and the DAC; and a residue amplifier that is coupled to the adder and the S/H circuit.

In accordance with a preferred embodiment of the present invention, the adder further comprises a node.

In accordance with a preferred embodiment of the present invention, the S/H circuit further comprises: a switch network that is coupled to the residue amplifier and the timing circuit; and an S/H amplifier that is coupled to the switch network and the comparator.

In accordance with a preferred embodiment of the present invention, the quantization loop further comprises: a voltage controlled oscillator (VCO) that is coupled to the S/H circuit and the timing circuit; and a counter that is coupled to the VCO and the timing circuit.

In accordance with a preferred embodiment of the present invention, the S/H circuit further comprises a sampling capacitor, and wherein quantization circuit further comprises: a comparator that is coupled to the S/H circuit so as to determine when a charge on the sampling capacitor is approximately zero; a controller that is coupled comparator and that generates a clock signal, a sample clock signal, and a control signal, wherein the sample clock signal is provided to the S/H circuit; a DAC that is coupled to the controller so as to receive the control signal and that is coupled to the S/H circuit so as to discharge the sampling capacitor at a predetermined rate, wherein the control signal sets the predetermined rate; and a counter that is coupled to the controller so as to receive clock signal, wherein the counter determines the rate of change of discharge of the sampling capacitor.

In accordance with a preferred embodiment of the present invention, a method is provided. The method further comprises sampling an analog input signal at a first sampling instant to generate a first sampled signal; selecting a resolution for the first sampled signal substantially at random; converting the first sampled signal to a digital output signal; and sampling the analog input signal at a second sampling instant to generate a second samples signal, wherein an interval between the first sampling instant and the second sampling instant is based at least in part on the resolution selected.

In accordance with a preferred embodiment of the present invention, the step of converting further comprises converting the first sampled signal to a digital output signal over a number of iterations through a quantization loop, wherein the number of iterations corresponds to the resolution selected.

In accordance with a preferred embodiment of the present invention, the step of converting further comprises: comparing the first sampled signal to a reference signal; adjusting the reference signal in response to the comparison between the first sampled signal and the reference signal; and repeating the steps of comparing and adjusting until a measured resolution is approximately equal to the resolution selected.

In accordance with a preferred embodiment of the present invention, the step of converting further comprises: resolving a portion of the digital output signal; converting the portion to an analog feedback signal; subtracting the analog feedback signal to generate a residue signal; and repeating the steps of resolving, converting, and subtracting until a measured resolution is approximately equal to the resolution selected.

In accordance with a preferred embodiment of the present invention, the step of sampling further comprises charging a sampling capacitor.

In accordance with a preferred embodiment of the present invention, the step of selecting further comprises selecting a discharge rate for the sampling capacitor substantially at random.

In accordance with a preferred embodiment of the present invention, the step of converting further comprises: discharging the sampling capacitor at the discharge rate over a discharge interval until the sampling capacitor has substantially discharged; and measuring the duration of the discharge interval.

In accordance with a preferred embodiment of the present invention, an apparatus is provided. The apparatus comprises an S/H circuit that is configured to sample an analog input signal at a first sampling instant and a second sampling instant to generate a first sampled signal and a second sampled signal; and a quantization circuit that is coupled to the S/H circuit so as to receive the first and second sampled signals, wherein the quantization circuit selects a resolution for the first sampled signal substantially at random, and wherein an interval between the first and second sampled signals is based at least in part on the resolution.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
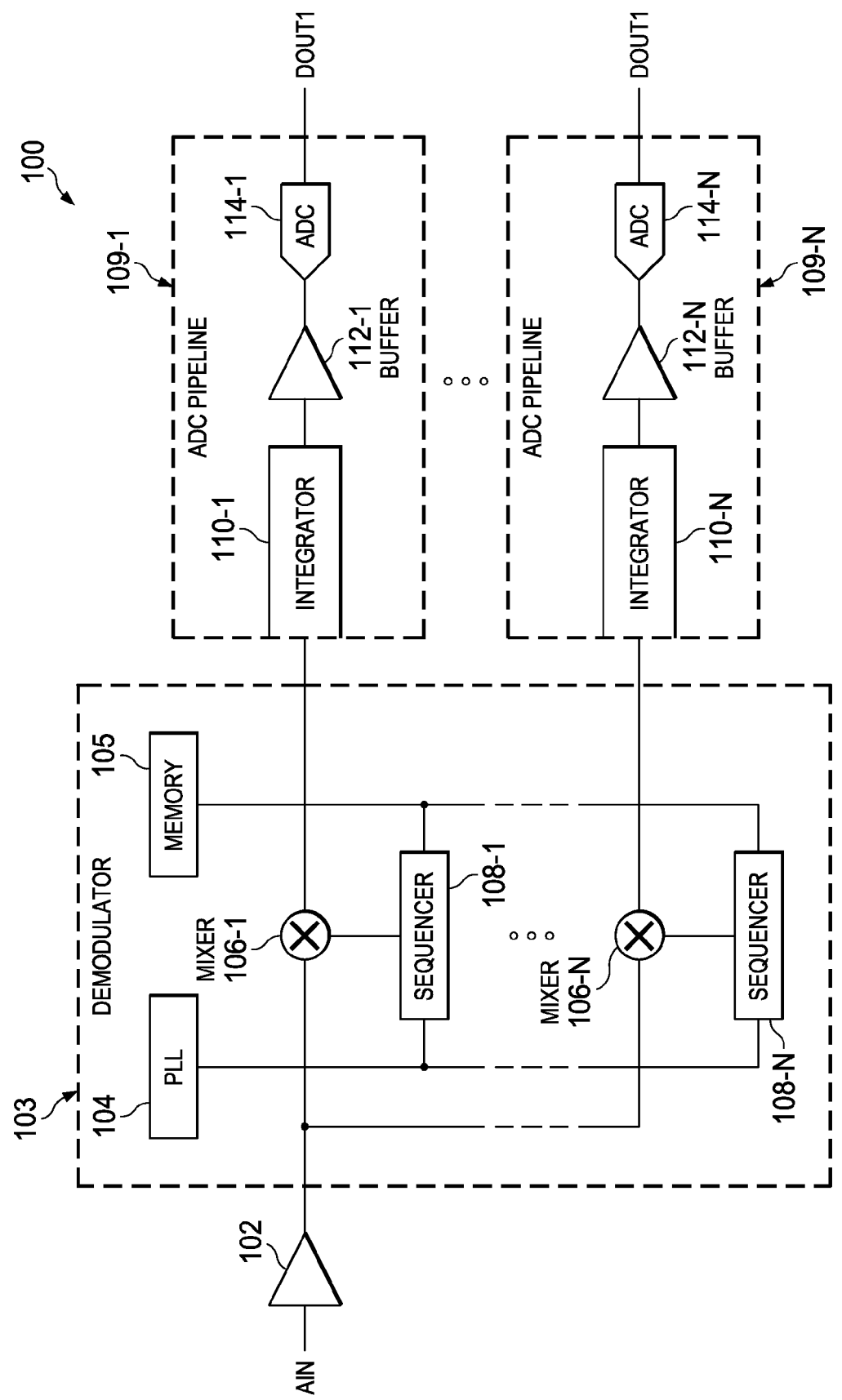
FIG. 1 is a conventional CS-ADC.

Refer now to the drawings wherein depicted elements are, for the sake of clarity, not necessarily shown to scale and wherein like or similar elements are designated by the same reference numeral through the several views.

Figure 2:
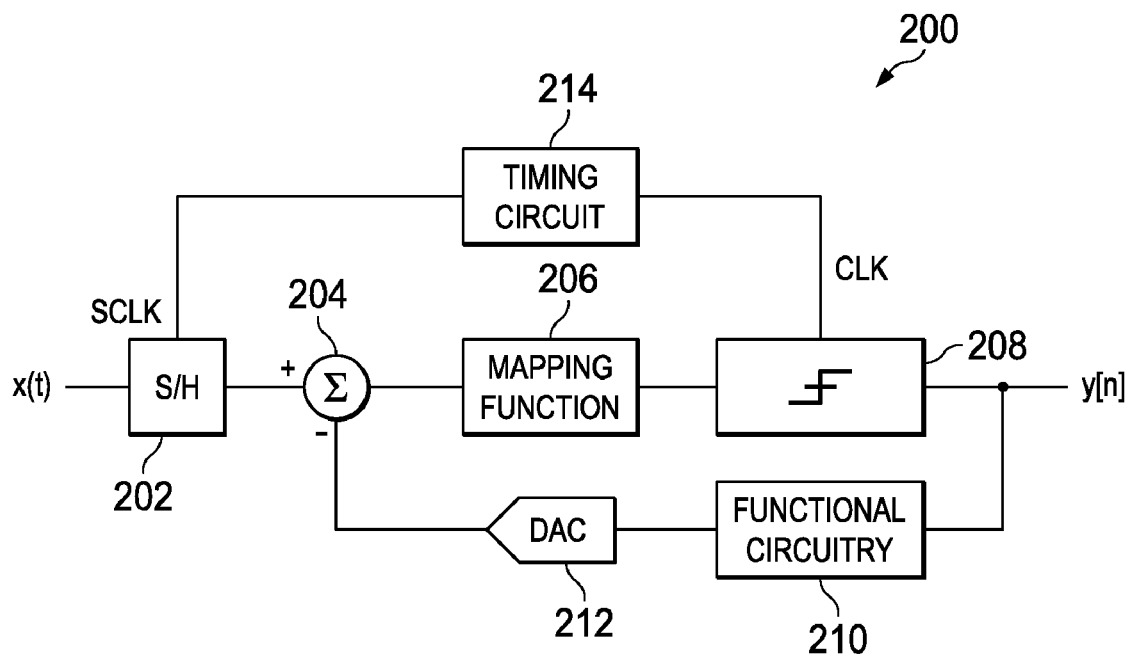
FIG. 2 is a diagram of an example of a generalized, controllable CS-ADC in accordance with an embodiment of the present invention.

Turning to FIG. 2, a diagram of a generalized, controllable CS-ADC 200 can be seen. This CS-ADC 200 generally comprises an sample-and-hold (S/H) circuit 202 and a quantization circuit, and the quantization circuit is generally comprised of a quantization loop that includes an adder 204 (which may be a node), a mapping function 206, a quantizer 208, functional circuitry 210, a DAC 212, and a timing circuit 214. In operation, the timing circuit 214 (which can also operate in-whole or in-part as a control circuit) generates a sample clock signal SCLK and a clock signal CLK. The clock signal CLK is generally used by the quantization loop to resolve the digital output signal, while the sample clock signal SCLK is typically used by the S/H circuit 202 to sample the analog input signal x(t) at sampling instants. Typically, a control circuit (i.e., timing circuit 214, functional circuitry 210, or some combination thereof) will select a resolution substantially at random for each sample of the analog input signal x(t). When selecting the resolution substantially at random, the control circuit can select one of many resolutions available with the circuitry provided using an algorithm, method, or circuit that would approximate a random pattern (i.e., use of a linear feedback shift register (LFSR) or pseudorandom number generator implemented in software).

For the quantization loop of the CS-ADC 200, resolution is generally based on the number of iterations Λ through the loop or cycles. Typically, the mapping function 206 (which may or may not be used) and quantizer 208 (i.e., comparator) perform a conversion from analog to digital, and, typically, functional circuitry 210 (i.e., logic) and DAC 212 perform digital to analog conversion. The adder 204 can then subtract the sampled signal from the analog output of DAC 212 to generate a residue signal so that a conversion can be performed on the residue signal. As the number of cycles or iterations Λ through the quantization loop increase, the resolution increases, but use of a substantially randomly selected resolution would inhibit the use of a generally uniform sample clock signal SCLK. Thus, the timing circuit 214 will skew or adjust the spacing or interval between consecutive samples based at least in part on the selected resolution of the earlier sample; other factors, like recover or reset timing, may also affect these intervals.

Figure 3:
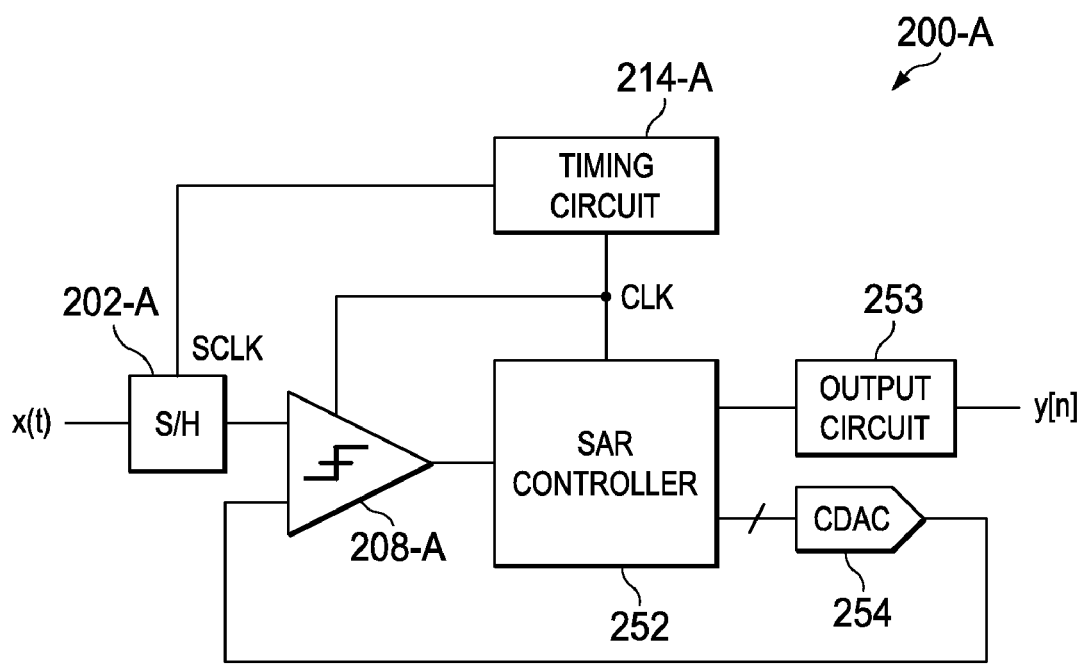
FIG. 3 is a diagram of an example of a controllable CS-ADC of FIG. 2 implemented as a successive approximation register (SAR) CS-ADC.

Now, turning to FIG. 3, an example of the CS-ADC 200 implemented as a SAR ADC 200-A can be seen. In this example, the quantizer 208-A (which is a comparator in this example), SAR controller 252, capacitive DAC (CDAC) 254, and output circuit 253 function as the quantization loop. In operation, the SAR controller 252 selects the resolution for the conversion of each sample from the S/H circuit 202-A (which can, for example, be an S/H amplifier) substantially at random. The comparator 208-A operates on the clock signal CLK (which is generated by timing circuit 214-A and which has a period $T_{CLK}$ that is less than the period $T_{SCLK}$ of the sample clock signal SCLK) so as (for example) to resolve one bit per cycle or period TCLK, and the timing circuit 214-A adjusts the period $T_{SCLK}$ with the selected resolutions. In particular, the operation of SAR ADC 200-A can be represented by the following equation:

$$x_i(nT_{SCLK} + kT_{CLK}) = x(nT_{SCLK}) - \sum_{m=1}^{k} d(m)\frac{REF}{2^m}, \quad (1)$$

where $x_i(t)$ represented the input to comparator 208-A, $d(m)$ is the decision made for cycle m (i.e., +1 or −1), k is the resolution selected with k being an integer and $$k \in \left[1, 2, \ldots \left(\frac{T_{SCLK}}{T_{CLK}} - 1\right)\right],$$

and REF is a reference voltage. Thus, based on equation (1), the voltage x[n] for digital output can then be represented as follows:

$$x[n] = x(nT_{SCLK}) + q[n] = \sum_{m=1}^{k} d(m)\frac{REF}{2^m}, \quad (2)$$

where q[n] is the quantization noise, which is bounded by $REF/2^k$. For the r iterations (denoted by integer $\Lambda_r$) of SAR ADC 200-A, equation (2) would become:

$$x[r] = x(T_r) + q[r] = \sum_{m=1}^{\Lambda_r} d(m)\frac{REF}{2^m}. \quad (3)$$

This would mean that the quantization noise q[r] would be bounded by $$\frac{REF}{2^{\Lambda_r}},$$

and the sample time or sampling instant would be:

$$T_r = T_{r-1} + \Lambda_{r-1}T_{CLK} + T_{CLK}, \quad (4)$$

which indicates that the interval between samples at instants $T_{r-1}$ and $T_r$ is based on the resolution selected for sampling instant $T_{r-1}$.

Figure 4:
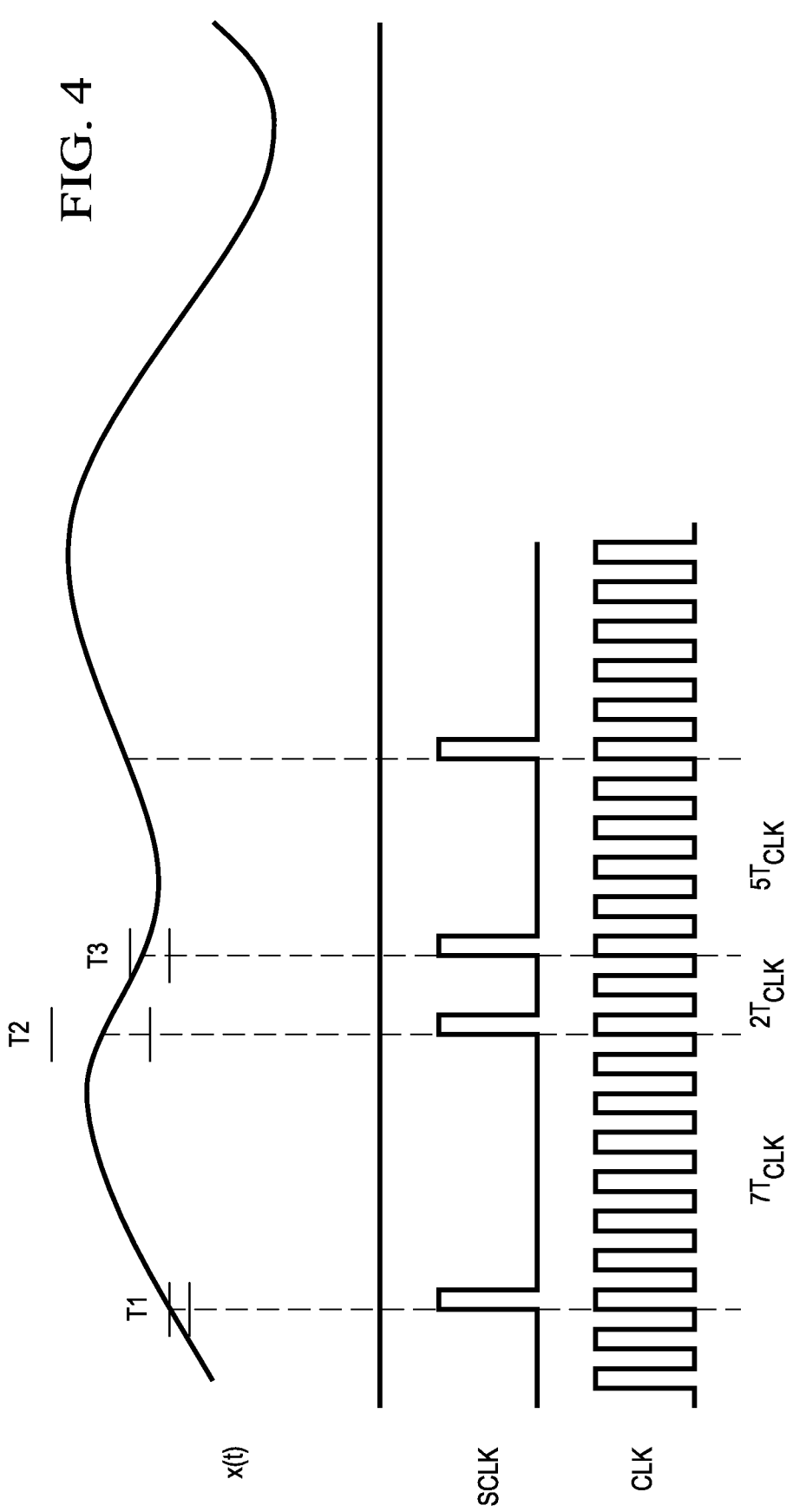
FIG. 4 is diagram illustrating the function of the SAR CS-ADC of FIG. 3.
Figure 5:
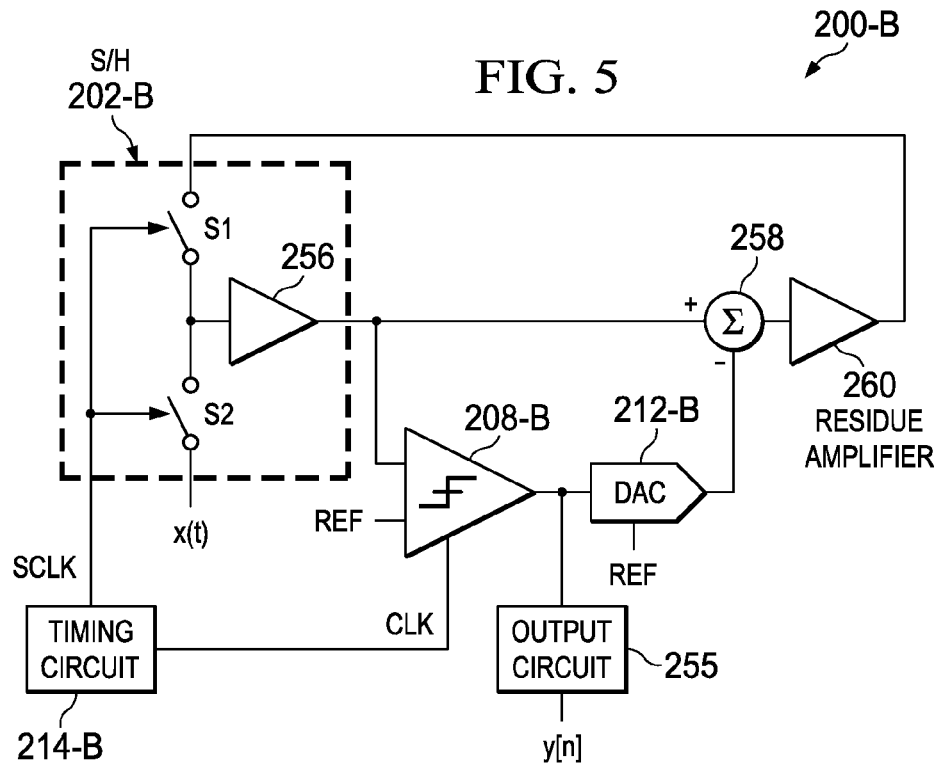
FIG. 5 is a diagram of an example of a controllable CS-ADC of FIG. 2 implemented as an algorithmic CS-ADC.

As shown in the example of FIG. 4, three samples from analog input signal x(t) are resolved by SAR ADC 200-A. For the first sample (at sampling instant T1), the SAR controller 252 selects a resolution of 6 or +/−REF/128. At sampling instant T1, the sample clock signal SCLK (which is generally aligned with clock signal CLK) would cause the S/H circuit 202-A to sample the analog input signal x(t), and, on the following rising edge of the clock signal CLK, the quantization loop of SAR ADC 200-A would resolve the sample from sampling instant T1 to a resolution of +/−REF/128 over six iterations. After resolution of the first sample (i.e., after $7T_{CLK}$), the timing circuit 214-A would generate a pulse in the sample clock signal SCLK which would correspond to sampling instant T2. For the sample at sampling instant T2, the SAR controller 202 selects the resolution to be 1 or +/−REF/4, and the quantization loop for SAR ADC 200-A performs the conversion on the next rising edge of clock signal CLK, resulting in a resolution period for the sample at instant T2 to be $2T_{CLK}$. Following the resolution of the second sample at instant T2, the SAR ADC 200-A resolves a third sample at instant T3 to a resolution of 4 or +/−REF/32 over $5T_{CLK}$. Thus, as can be seen, the analog input signal x(t) is sampled irregularly based on the resolution selected substantially at random.

Turning to an example of the CS-ADC 200-A implemented as an algorithmic ADC 200-B can be seen. As shown, the S/H circuit 202-B employs a switch network S1 and S2 that enable the S/H amplifier 256 to sample the input signal or a residue signal based on the sample clock signal SCLK from timing circuit 214-B. In this example, quantizer 208-B (which is a comparator in this example), DAC 212-B, and residue amplifier 260 function like a stage of a pipelined ADC using the clock signal CLK from timing circuit 214-B, and, together with the S/H circuit 202-B, this stage forms the quantization loop. Typically, the stage is configured to resolve one bit with each iteration, so the resolution increases with the number of iterations through the quantization loop. Additionally, the output circuit 255 can perform digital correction to generate the output signal y[n].

Figure 6:
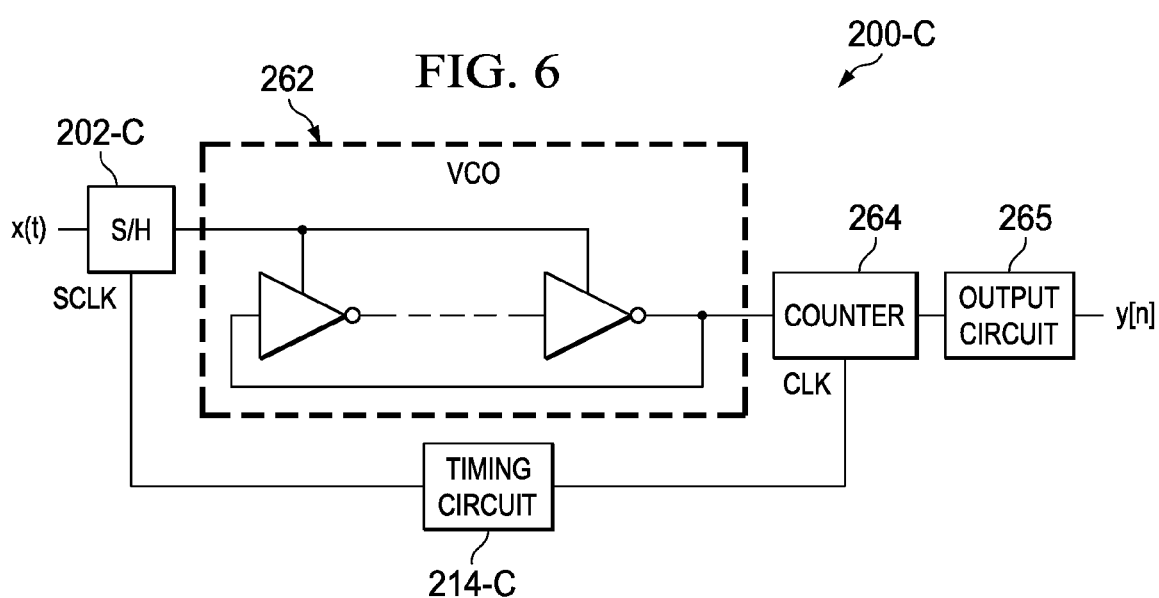
FIG. 6 is a diagram of an example of a controllable CS-ADC of FIG. 2 implemented as a voltage controlled oscillator (VCO) based CS-ADC.

In FIG. 6, an example of the CS-ADC 200-A implemented as a VCO based ADC 200-C can be seen. In this example, a VCO 262 (which has a configuration that is generally employed with Delay Locked Loops (DLLs)) receives a "control voltage" from the S/H circuit 202-C (which is the sampled input signal x(t) based on the sample clock signal SCLK from the timing circuit 214-C that varies the supply voltage for its inverters so as to generate an output signal having a frequency that is proportional to the "control voltage." Counting the number of edges (with counter 264) using the clock signal CLK from timing circuit 214-C will allow for an estimation of the "control voltage" by output circuit 265, where increasing the number of periods $T_{CLK}$ (which would be selected substantially at random by timing circuit 214-C) for counting will increase resolution.

Figure 7:
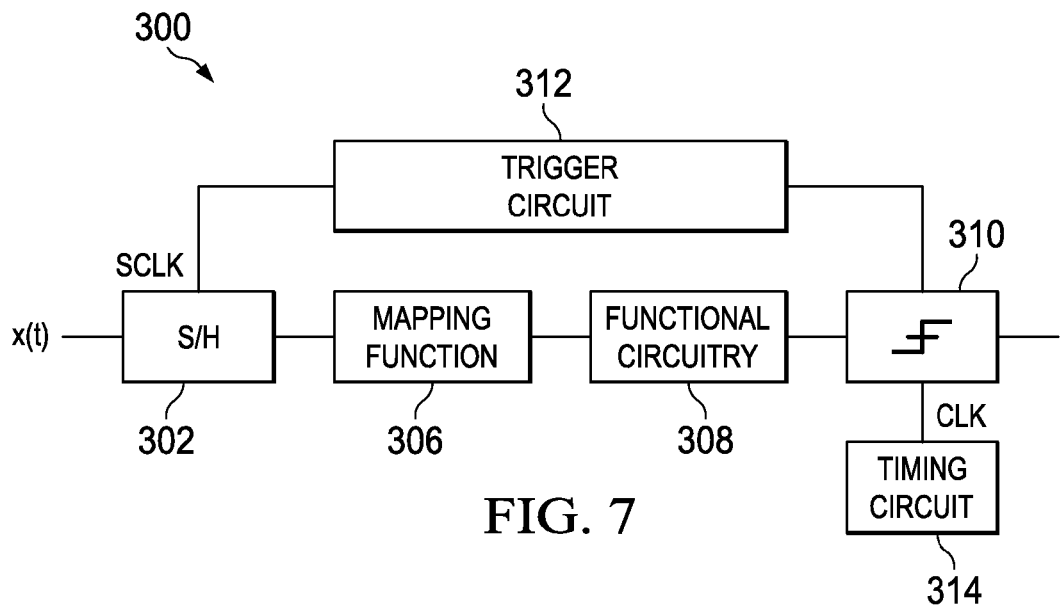
FIG. 7 is a diagram of an example of a generalized, partially controllable CS-ADC in accordance with an embodiment of the present invention.

Turning now to FIG. 7, another CS-ADC architecture can be seen. This architecture is a partially controllable CS-ADC 300. With this architecture, the sample clock signal SCLK is typically based on a state (i.e., zero-crossing) within the CS-ADC 300, and the clock signal CLK is controlled by the timing circuit 314 (which can function in-part or in-whole as a control circuit). As shown in FIG. 7, a generalized, structure for CS-ADC can be seen, and this CS-ADC 300 generally comprises an S/H circuit 302 (which can be an S/H amplifier) and a quantization circuit. The quantization circuit is generally comprised of a mapping function 306 (which can be optionally included), functional circuitry 308 (which may include control circuitry), a quantizer 310, and a trigger circuit 312 (which can be an inverter).

In operation, CS-ADC 300 is able to serially resolve samples the input signal substantially at random (where the sampling instants are selected substantially at random). Typically, when a triggering event (i.e., zero-crossing) occurs, the S/H circuit 302 samples the input signal x(t). The functional circuitry 308 (which typically functions as a controller or control circuitry) determines the resolution for the conversion of the sample substantially at random. The quantizer 310 then performs the conversion to the predetermined resolution using the clock signals CLK from timing circuit 314. Once the conversion has been performed to the predetermined resolution, the trigger circuit 312 causes the S/H circuit 302 to sample the input signal x(t) again.

Figure 8:
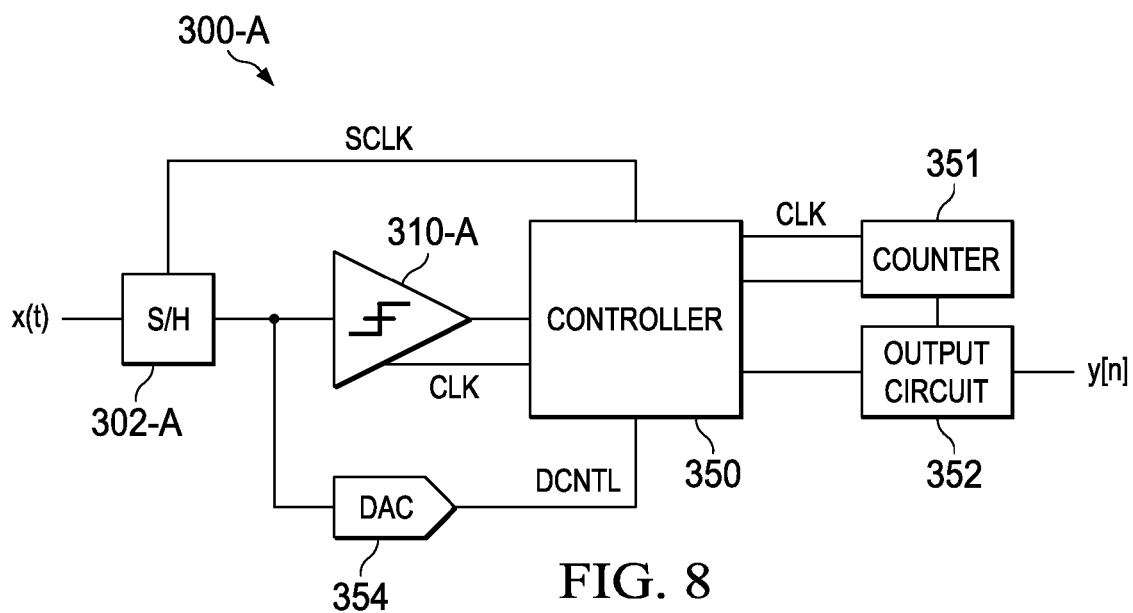
FIG. 8 is a diagram of an example of a partially controllable CS-ADC of FIG. 7 implemented as an integrating CS-ADC.
Figure 9:
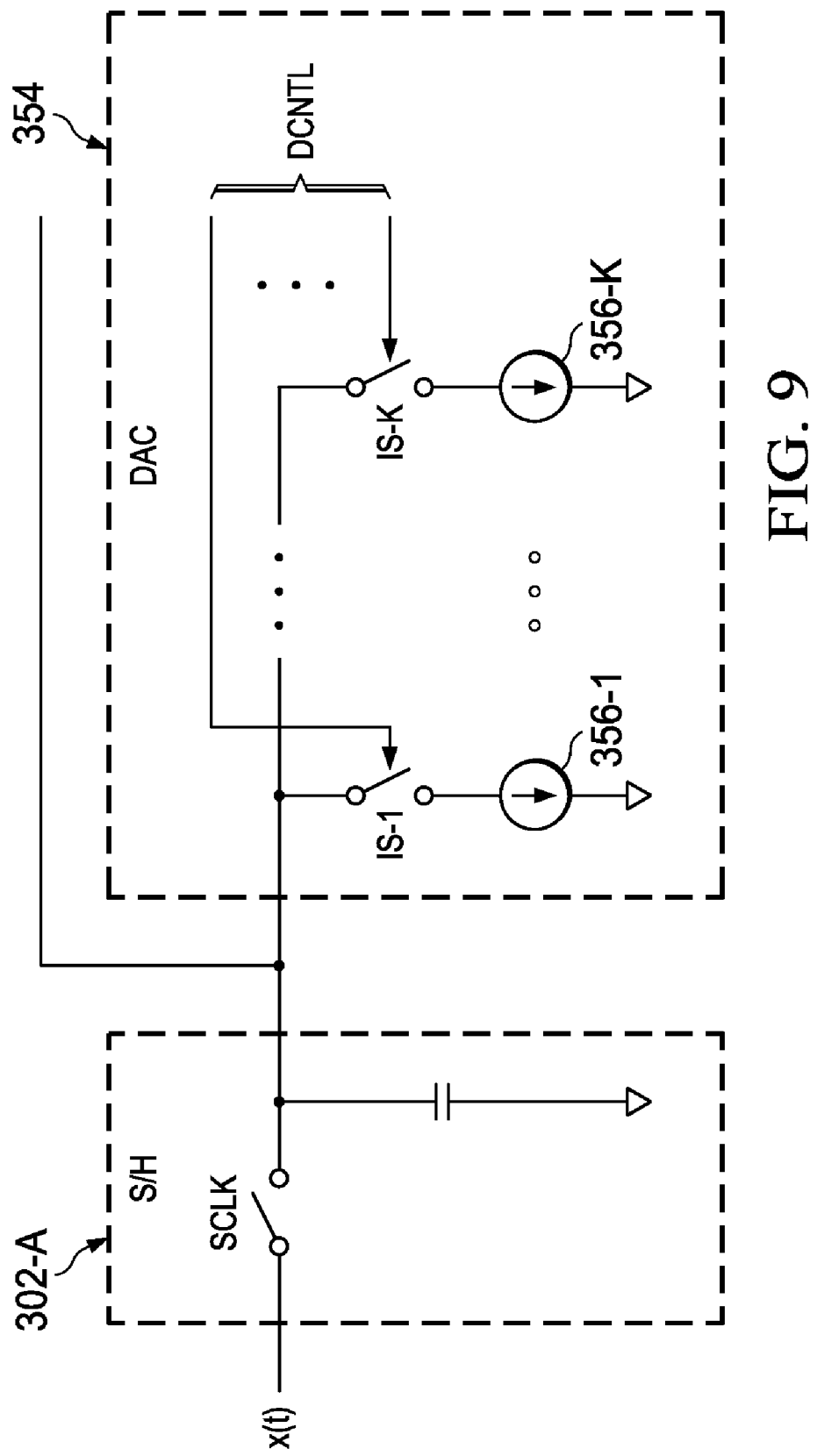
FIG. 9 is a diagram depicting the digital-to-analog (DAC) converter of FIG. 8 in greater detail.

An example of the CS-ADC 300 implemented as an integrating ADC 300-A is shown in FIGS. 8 and 9. Typically, the S/H circuit 302-A can be represented by a capacitor and switch, where the sampled input signal x(t) is stored on the capacitor. The sample clock signal SCLK (which is issued by controller 350) indicates when the sampling instant occurs. Once sampled, DAC 354 is able to "bleed off" charge from the capacitor within S/H circuit 302-A, which is different from a conventional integrating ADC that measures the time to reach a nonzero reference voltage. Because the DAC 354 is generally comprised of switches IS-1 to IS-k and current sources 356-1 to 356-k, the rate of the discharge of the capacitor can be varied based on the control signal DCNTL (which is selected by the controller 350 substantially at random). The counter 351 is then able to determine the time over which the discharge rate occurred (using the clock signal CLK), and once the charge on the capacitor within the S/H circuit 302-A becomes zero (which is a zero-crossing), the controller 350 can cause the S/H circuit 302-A to sample the input signal again. Based on this discharge time, the output circuit 352 can determine the voltage of the sampled input signal x(t), where the resolution is based on the rate of discharge.

Figure 10:
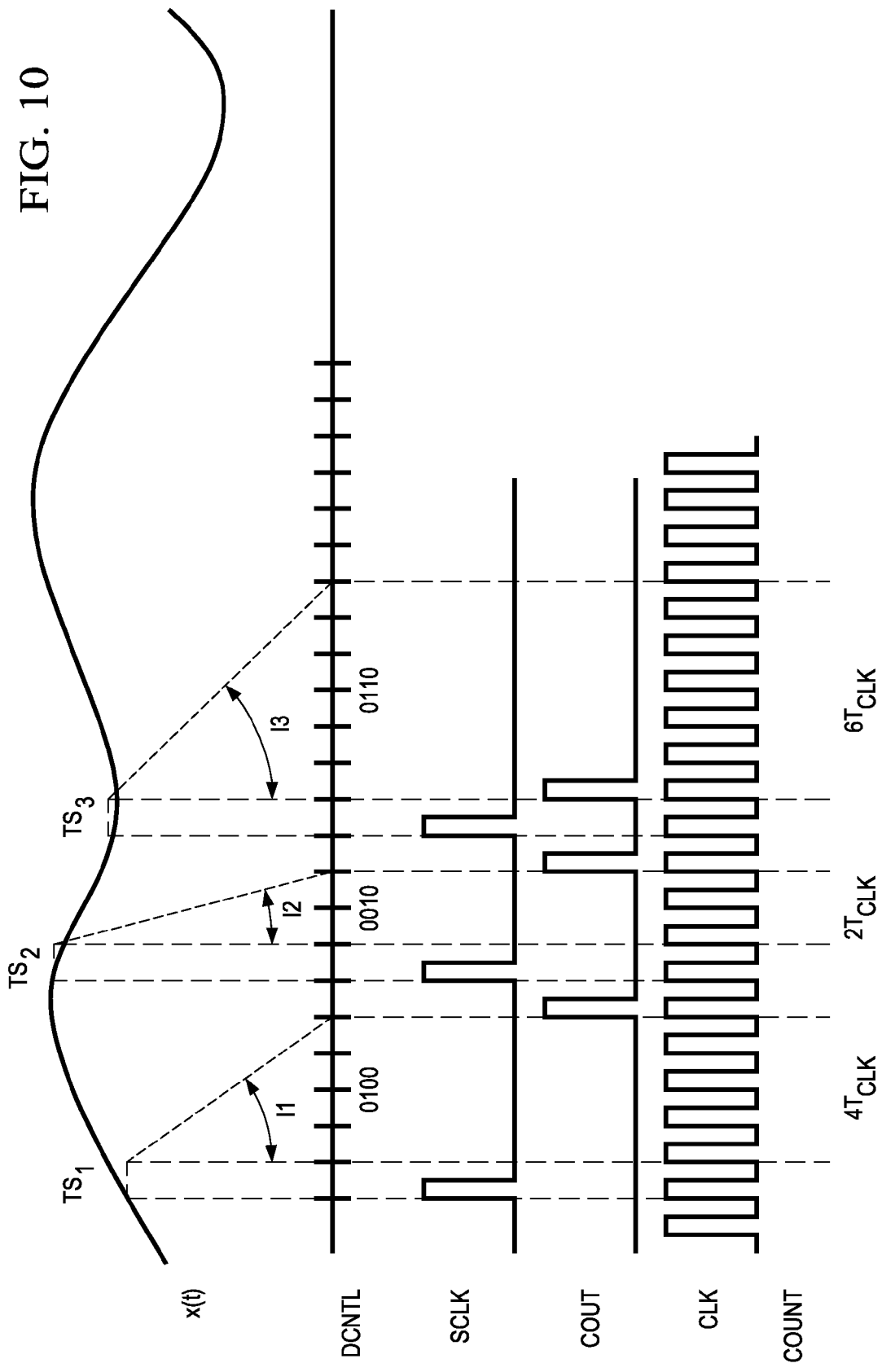
FIG. 10 is a diagram illustrating the function of the integrating CS-ADC of FIG. 8.

Turning to FIG. 10, a diagram depicting the operation of ADC 300-A can be seen. For the first sampling instant $Ts_1$, controller 350 selects a current I1 for the DAC 354 (which is selected based on the configuration of DAC 345 so as to be substantially at random or to have the appearance of randomness) using a control signal DCNTL having a digital code of "0100." This results in a time of $4T_{CLK}$ to discharge the capacitor within S/H circuit 302-A, where the voltage for this instant $Ts_1$ can be represented as:

$$x(Ts_1)=4*I/1*T_{CLK}+q(1), \quad (5)$$

where q(1) is quantization noise. Following the zero-crossing (indicated by signal COUT), the input signal x(t) is sampled at instant $Ts_2$. For instant $Ts_2$, the controller 350 selects the current for DAC 354 substantially at random to be current I2 with a control signal DCNTL of "0010." This results in a discharge time of $2T_{CLK}$, where the voltage for this instant $Ts_2$ can be represented as:

$$x(Ts_2)=2*I/2*T_{CLK}+q(2), \quad (6)$$

where q(2) is quantization noise. Following the zero-crossing (indicated by signal COUT), the input signal x(t) is sampled at instant $Ts_3$. For instant $Ts_3$, the controller 350 selects the current for DAC 354 substantially at random to be current I3 with a control signal DCNTL of "0110." This results in a discharge time of $6T_{CLK}$, where the voltage for this instant $Ts_3$ can be represented as:

$$x(Ts_3)=6*I/3*T_{CLK}+q(3), \quad (7)$$

where q(3) is quantization noise. It should also be noted that the following relationships exist between the sampling instants $Ts_1$, $Ts_2$, and $Ts_3$ because the duration intervals between each pair of consecutive instants is based on the resolution of the earlier instant of the pair:

$$Ts_2=Ts_1+2T_{CLK}+4T_{CLK}, \quad (8)$$

$$Ts_3=Ts_2+2T_{CLK}+2T_{CLK}, \quad (9)$$

Equations (5)-(9) can then be generalized as follows:

$$x(Ts_n)=K_n I_n T_{CLK}+q(n) \quad (9)$$

and $$Ts_n=Ts_{n-1}+2T_{CLK}+K_n T_{CLK}, \quad (10)$$

where $$K_n = \left[\frac{x(Ts_n)}{I_n T_{CLK}}\right]. \quad (11)$$

Thus, from equations (8) to (11), CS-ADC 300 is shown to be partially controllable because sampling instants are substantially random but are dependant on the selected or predetermined resolution for the previous sampling instant.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a sample-and-hold (S/H) circuit; and
   a quantization circuit that is coupled to the S/H circuit so as to receive a plurality of samples from the S/H circuit, wherein the quantization circuit generates a digital output signal for each sample, and wherein each resolution for each digital output signal is selected substantially at random, and wherein intervals between consecutive samples are each based at least in part on the resolution of at least one of its samples.

2. The apparatus of claim 1, wherein the quantization circuit further comprises a quantization loop such that each resolution for each digital output signal corresponds to its number of iterations through the quantization loop.

3. The apparatus of claim 2, wherein the quantization loop further comprises a timing circuit that generates a clock signal and a sample clock signal, wherein the sample clock signal is provided to the S/H circuit.

4. The apparatus of claim 3, wherein the quantization loop further comprises a quantizer that is coupled to the S/H circuit so as to receive the plurality of samples and that is coupled to the timing circuit so as to receive the clock signal.

5. The apparatus of claim 4, wherein the quantizer further comprises a comparator, and wherein the quantization loop further comprises:
   a successive approximation register (SAR) controller that is coupled to the quantizer and the timing circuit; and
   a capacitive digital-to-analog converter (CDAC) that is coupled to the SAR controller and the comparator.

6. The apparatus of claim 4, wherein the quantizer further comprise a comparator that receives a reference signal, and wherein the quantization loop further comprises:
   a digital-to-analog converter (DAC) that is coupled to the comparator and that receives the reference signal;
   an adder that is coupled to the S/H circuit and the DAC; and
   a residue amplifier that is coupled to the adder and the S/H circuit.

7. The apparatus of claim 6, wherein the adder further comprises a node.

8. The apparatus of claim 6, wherein the S/H circuit further comprises:
   a switch network that is coupled to the residue amplifier and the timing circuit; and
   an S/H amplifier that is coupled to the switch network and the comparator.

9. The apparatus of claim 3, wherein the quantization loop further comprises:
   a voltage controlled oscillator (VCO) that is coupled to the S/H circuit and the timing circuit; and
   a counter that is coupled to the VCO and the timing circuit.

10. The apparatus of claim 1, wherein the S/H circuit further comprises a sampling capacitor, and wherein quantization circuit further comprises:
    a comparator that is coupled to the S/H circuit so as to determine when a charge on the sampling capacitor is approximately zero;
    a controller that is coupled comparator and that generates a clock signal, a sample clock signal, and a control signal, wherein the sample clock signal is provided to the S/H circuit;
    a DAC that is coupled to the controller so as to receive the control signal and that is coupled to the S/H circuit so as to discharge the sampling capacitor at a predetermined rate, wherein the control signal sets the predetermined rate; and
    a counter that is coupled to the controller so as to receive clock signal, wherein the counter determines the rate of change of discharge of the sampling capacitor.

11. A method comprising:
    sampling an analog input signal at a first sampling instant to generate a first sampled signal;
    selecting a resolution for the first sampled signal substantially at random;
    converting the first sampled signal to a digital output signal; and
    sampling the analog input signal at a second sampling instant to generate a second samples signal, wherein an interval between the first sampling instant and the second sampling instant is based at least in part on the resolution selected.

12. The method of claim 10, wherein the step of converting further comprises converting the first sampled signal to a digital output signal over a number of iterations through a quantization loop, wherein the number of iterations corresponds to the resolution selected.

13. The method of claim 12, wherein the step of converting further comprises:
    comparing the first sampled signal to a reference signal;
    adjusting the reference signal in response to the comparison between the first sampled signal and the reference signal; and
    repeating the steps of comparing and adjusting until a measured resolution is approximately equal to the resolution selected.

14. The method of claim 12, wherein the step of converting further comprises:
    resolving a portion of the digital output signal;
    converting the portion to an analog feedback signal;
    subtracting the analog feedback signal to generate a residue signal; and
    repeating the steps of resolving, converting, and subtracting until a measured resolution is approximately equal to the resolution selected.

15. The method of claim 11, wherein the step of sampling further comprises charging a sampling capacitor.

16. The method of claim 15, wherein the step of selecting further comprises selecting a discharge rate for the sampling capacitor substantially at random.

17. The method of claim 16, wherein the step of converting further comprises:
    discharging the sampling capacitor at the discharge rate over a discharge interval until the sampling capacitor has substantially discharged; and
    measuring the duration of the discharge interval.

18. An apparatus comprising:
    an S/H circuit that is configured to sample an analog input signal at a first sampling instant and a second sampling instant to generate a first sampled signal and a second sampled signal; and
    a quantization circuit that is coupled to the S/H circuit so as to receive the first and second sampled signals, wherein the quantization circuit selects a resolution for the first sampled signal substantially at random, and wherein an interval between the first and second sampled signals is based at least in part on the resolution.

19. The apparatus of claim 18, wherein the quantization circuit further comprises a quantization loop such that the resolution for the first sampled signal corresponds to its number of iterations through the quantization loop.

20. The apparatus of claim 19, wherein the quantization loop further comprises a timing circuit that generates a clock signal and a sample clock signal, wherein the sample clock signal is provided to the S/H circuit.

21. The apparatus of claim 20, wherein the quantization loop further comprises a quantizer that is coupled to the S/H circuit so as to receive the plurality of samples and that is coupled to the timing circuit so as to receive the clock signal.

22. The apparatus of claim 21, wherein the quantizer further comprises a comparator, and wherein the quantization loop further comprises:
    a SAR controller that is coupled to the quantizer and the timing circuit; and
    a CDAC that is coupled to the SAR controller and the comparator.

23. The apparatus of claim 21, wherein the quantizer further comprise a comparator that receives a reference signal, and wherein the quantization loop further comprises:
    a digital-to-analog converter (DAC) that is coupled to the comparator and that receives the reference signal;
    an adder that is coupled to the S/H circuit and the DAC; and
    a residue amplifier that is coupled to the adder and the S/H circuit.

24. The apparatus of claim 23, wherein the adder further comprises a node.

25. The apparatus of claim 23, wherein the S/H circuit further comprises:
- a switch network that is coupled to the residue amplifier and the timing circuit; and
- an S/H amplifier that is coupled to the switch network and the comparator.

26. The apparatus of claim 20, wherein the quantization loop further comprises:
- a voltage controlled oscillator (VCO) that is coupled to the S/H circuit and the timing circuit; and
- a counter that is coupled to the VCO and the timing circuit.

27. The apparatus of claim 18, wherein the S/H circuit further comprises a sampling capacitor, and wherein quantization circuit further comprises:
- a comparator that is coupled to the S/H circuit so as to determine when a charge on the sampling capacitor is approximately zero;
- a controller that is coupled comparator and that generates a clock signal, a sample clock signal, and a control signal, wherein the sample clock signal is provided to the S/H circuit;
- a DAC that is coupled to the controller so as to receive the control signal and that is coupled to the S/H circuit so as to discharge the sampling capacitor at a predetermined rate, wherein the control signal sets the predetermined rate; and
- a counter that is coupled to the controller so as to receive clock signal, wherein the counter determines the rate of change of discharge of the sampling capacitor.

* * * * *